(12) United States Patent
Rizvi et al.

(10) Patent No.: US 10,848,147 B2
(45) Date of Patent: Nov. 24, 2020

(54) HIGH PERFORMANCE I2C TRANSMITTER AND BUS SUPPLY INDEPENDENT RECEIVER, SUPPORTING LARGE SUPPLY VOLTAGE VARIATIONS

(71) Applicant: STMICROELECTRONICS INTERNATIONAL N.V., Schiphol (NL)

(72) Inventors: Saiyid Mohammad Irshad Rizvi, New Delhi (IN); Atul Dwivedi, Benares (IN)

(73) Assignee: STMICROELECTRONICS INTERNATIONAL N.V., Schiphol (NL)

( * ) Notice: Subject to any disclaimer, the term of this patent is extended or adjusted under 35 U.S.C. 154(b) by 215 days.

(21) Appl. No.: 15/821,387

(22) Filed: Nov. 22, 2017

(65) Prior Publication Data
US 2019/0158085 A1 May 23, 2019

(51) Int. Cl.
| | | |
|---|---|---|
| H03B 1/00 | (2006.01) | |
| H03K 3/00 | (2006.01) | |
| H03K 17/687 | (2006.01) | |
| G05F 3/24 | (2006.01) | |
| G06F 13/42 | (2006.01) | |
| H03K 19/0175 | (2006.01) | |
| H03K 19/0185 | (2006.01) | |
| H03K 3/037 | (2006.01) | |

(52) U.S. Cl.
CPC ............. *H03K 17/687* (2013.01); *G05F 3/24* (2013.01); *G06F 13/4282* (2013.01); *H03K 19/017509* (2013.01); *H03K 19/018507* (2013.01); *H03K 19/018592* (2013.01); *H03K 3/0377* (2013.01)

(58) Field of Classification Search
CPC ......... H03K 17/687; H03K 19/018507; H03K 19/018592; H03K 19/017509; H03K 3/0377; G06F 13/4282; G05F 3/24
USPC ....................................................... 327/108
See application file for complete search history.

(56) References Cited

U.S. PATENT DOCUMENTS 5,461,306 A * 10/1995 Niven .................. G01R 19/003
324/102
6,262,592 B1 * 7/2001 Kim ........................ G05F 3/242
326/31
(Continued)

FOREIGN PATENT DOCUMENTS

| CN | 202931279 U | 5/2013 |
|---|---|---|
| DE | 199 00 869 A1 | 7/2000 |

(Continued)

*Primary Examiner* — Metasebia T Retebo
(74) *Attorney, Agent, or Firm* — Seed IP Law Group LLP

(57) ABSTRACT

One or more embodiments are directed to inter-integrated circuit (I2C) transmitters, receivers, and devices that utilize a stable reference voltage for driving a pre-driver of the transmitter and for driving a first input stage of the receiver. One embodiment is directed to a device A device that includes an inter-integrated circuit (I2C) transmitter and an I2C receiver. The I2C transmitter includes a driver coupled to an I2C data line, and a pre-driver coupled to a variable first supply voltage, a second supply voltage, and a reference voltage. The pre-driver is configured to output a control signal to a control terminal of the driver. The I2C receiver includes a first stage coupled to the I2C data line, the variable first supply voltage, the second supply voltage, and the reference voltage.

20 Claims, 8 Drawing Sheets

(56) References Cited

U.S. PATENT DOCUMENTS

| | | | |
|---|---|---|---|
| 6,615,301 B1* | 9/2003 | Lee | G06F 13/4072 |
| | | | 326/21 |
| 2005/0262285 A1 | 11/2005 | Kang | |
| 2006/0068917 A1* | 3/2006 | Snoddy | A63F 13/24 |
| | | | 463/42 |
| 2008/0278224 A1* | 11/2008 | Chi | H03F 3/45183 |
| | | | 327/541 |
| 2010/0291919 A1 | 11/2010 | Whittam et al. | |
| 2013/0127548 A1* | 5/2013 | Popplewell | H03F 3/19 |
| | | | 330/297 |
| 2013/0207694 A1* | 8/2013 | Hsu | H03K 19/0013 |
| | | | 327/108 |
| 2016/0182022 A1* | 6/2016 | Kumar | H03K 3/3565 |
| | | | 327/206 |
| 2017/0222649 A1* | 8/2017 | Koo | H03K 19/018592 |

FOREIGN PATENT DOCUMENTS

| | | |
|---|---|---|
| DE | 100 34 087 A1 | 1/2002 |
| DE | 10 2011 080 500 A1 | 2/2013 |
| KR | 101845326 B1 * | 4/2018 |

\* cited by examiner

HIGH PERFORMANCE I2C TRANSMITTER AND BUS SUPPLY INDEPENDENT RECEIVER, SUPPORTING LARGE SUPPLY VOLTAGE VARIATIONS

BACKGROUND

Technical Field

The present disclosure is generally related to inter-integrated circuit (I2C) transmitter and receiver circuits, and more particularly, to I2C transmitters and receivers that receive a stable reference voltage for driving a last stage of the transmitter and a first stage of the receiver.

Description of the Related Art

Input/Output buffers (I/Os) form an integral part of any chip. These I/Os are circuits that help the chip communicate with the external environment, e.g., to transmit and receive data from other chips or devices. The external environment can be unpredictable at times, and further, the operation conditions of the I/Os themselves can experience many changes, which adds a further degree of complexity.

In battery operated circuits, which typically operate for large ranges of supply voltages, the drive capability of an NMOS transistor varies quadratically with the supply voltage. In such scenarios, it is very difficult to meet stringent specifications such as inter-integrated circuit (I2C) specifications for Tr, Tf, loopdelay, and the like.

Original implementations of I2C supported data signaling rates of up to 100 kilobits per second (100 kbps) in standard-mode operation, with more recent standards supporting speeds of 400 kbps in a fast-mode operation, and 1 megabit per second (Mbps) in a fast-mode plus (Fast+ mode) operation.

BRIEF SUMMARY

The present disclosure provides various embodiments of I2C I/O transmitters and receivers that receive a stable reference voltage in place of a variable supply voltage in at least one of the stages of the transmitter or receiver. The transmitter has a stable reference voltage (e.g. Vref) coupled to a last stage in the transmitter (e.g., a last stage of the pre-driver in a transmitter), in contrast to the conventional approach, in which a variable supply voltage (VDDE) is used as the supply voltage for all stages of the transmitter. Because Vref is stable, the transmitter drive spread is decreased, and the transmitter's operating speed is increased.

The same concept is applied to the receiver. Namely, a stable reference voltage (Vref) is used to drive the first stage of the receiver (e.g., an inverting Schmitt trigger or an inverter), instead of using VDDE. Vref is always lower than a bus supply voltage VBUS provided to the I2C data line, which prevents any short circuit current from being consumed in the receiver.

In one embodiment, the present disclosure provides an inter-integrated circuit (I2C) transmitter that includes an input terminal, an output terminal, a driver coupled to an I2C data line via the output terminal, and a pre-driver. The pre-driver is coupled to a variable first supply voltage, a second supply voltage, and a reference voltage. The pre-driver outputs a control signal to a control terminal of the driver based on an input signal at the input terminal, and the control signal has a voltage level of one of the second supply voltage and the reference voltage.

In another embodiment, the present disclosure provides an inter-integrated circuit (I2C) receiver that includes an input terminal, an output terminal, and a first stage. The first stage is coupled to an I2C data line via the input terminal, and the first stage coupled to a variable first supply voltage, a second supply voltage, and a reference voltage. The reference voltage has a voltage level that is less than a lowest voltage level of a variable bus supply voltage supplied to the I2C data line.

In another embodiment, the present disclosure provides a device that includes an inter-integrated circuit (I2C) transmitter and an I2C receiver. The I2C transmitter includes a driver coupled to an I2C data line, and a pre-driver coupled to a variable first supply voltage, a second supply voltage, and a reference voltage. The pre-driver is configured to output a control signal to a control terminal of the driver. The I2C receiver includes a first stage coupled to the I2C data line, the variable first supply voltage, the second supply voltage, and the reference voltage.

In yet another embodiment, the present disclosure provides a method that includes: supplying a variable first supply voltage, a second supply voltage, and a stable reference voltage to a pre-driver of an inter-integrated circuit (I2C) transmitter; controlling, by the pre-driver, a driver of the I2C transmitter with a control signal having a voltage level of one of the second supply voltage and the stable reference voltage; and supplying the variable first supply voltage, the second supply voltage, and the stable reference voltage to a first input stage of an I2C receiver.

DETAILED DESCRIPTION

The present disclosure provides inter-integrated circuit (I2C) transmitters, receivers, devices, and methods that utilize a stable reference voltage in addition to a variable first supply voltage and a second voltage, such as a ground voltage. These I2C transmitters and receivers may be part of a processor or other central processing unit in handheld or other electronic devices. These I2C transmitters and receivers assist in communication between various electronic components within an electronic device. These I2C transmitters and receivers will reduce power consumption and extend battery life of battery operated circuits in these electronic devices.

Figure 1:
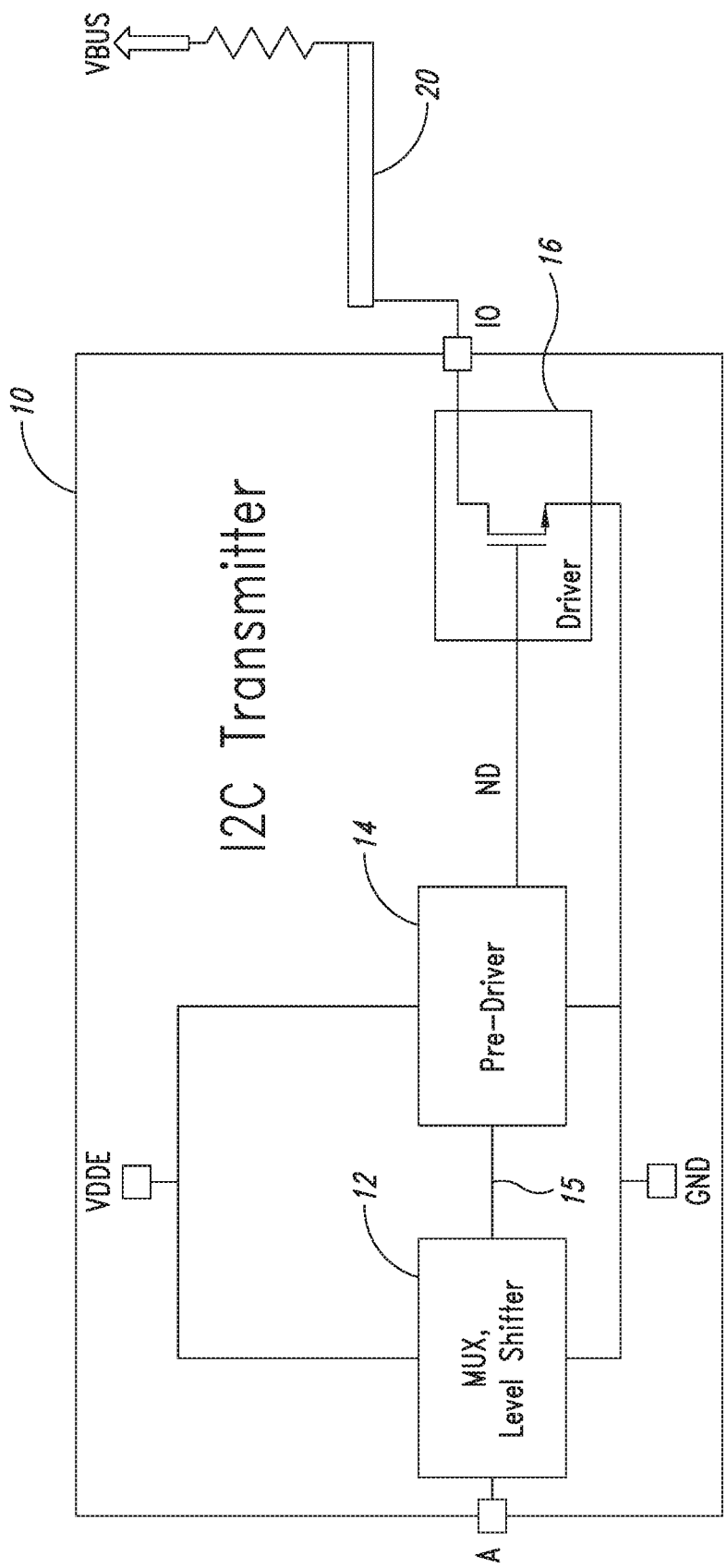
FIG. 1 is a schematic diagram illustrating an I2C transmitter having a pre-driver coupled to an unregulated supply voltage.

In certain applications, such as in battery operated circuits which operate in large ranges of supply voltages, a drive capability of an NMOS driver 16 in an I2C transmitter 10 or receiver 50 varies quadratically in relation to the supply voltage. For example, a drive current can vary from about 10 mA to about 72 mA when a supply voltage VDDE ranges between about 1.62V and 3.78V. This variation in the drive current extends outside of I2C specifications, and then limits the speed of the I2C transmitter. For example, with such a wide range of drive current, the I2C transmitter is incapable of operating at 1 Mbps speed. FIG. 1 is a schematic diagram illustrating an I2C transmitter 10 that includes the NMOS driver 16 that is coupled between the unregulated supply voltage VDDE and ground GND, the drive signal ND is provided at either the supply voltage VDDE or the ground GND voltage levels. The I2C transmitter 10 includes a multiplexer and level shifter 12 and a pre-driver 14, which are each coupled to VDDE. The transmitter 10 includes an input terminal A that receives a core signal from other components within the chip that includes the I2C transmitter 10. The core signal is any internal chip level signal that is to be communicated to the outside environment, i.e., to the I2C data line 20 via an input/output terminal 10.

The core signal provided at the input terminal A may include multiple signals. For example, the core signal may include the chip level data signal that is to be communicated to the I2C data line 20, and may further include control signals, such as an enable signal or the like, for control of the circuitry in the transmitter 10. The multiplexer and level shifter 12 receive the signals from the input terminal A, and select and level shift the signals to provide a control signal 15 to the pre-driver 14 that is used to generate a drive signal for driving the driver 16 to output data to the I2C data line 20.

The pre-driver 14 receives the control signal and outputs a drive signal ND based on the control signal to control the driver 16. The pre-driver 14 may include a plurality of elements, such as logic stages, and a final stage or an output stage is coupled to an unregulated supply voltage VDDE. The pre-driver 14 may include a logic element such as a buffer or an inverter that outputs the drive signal ND to control the driver 16.

Figure 2:
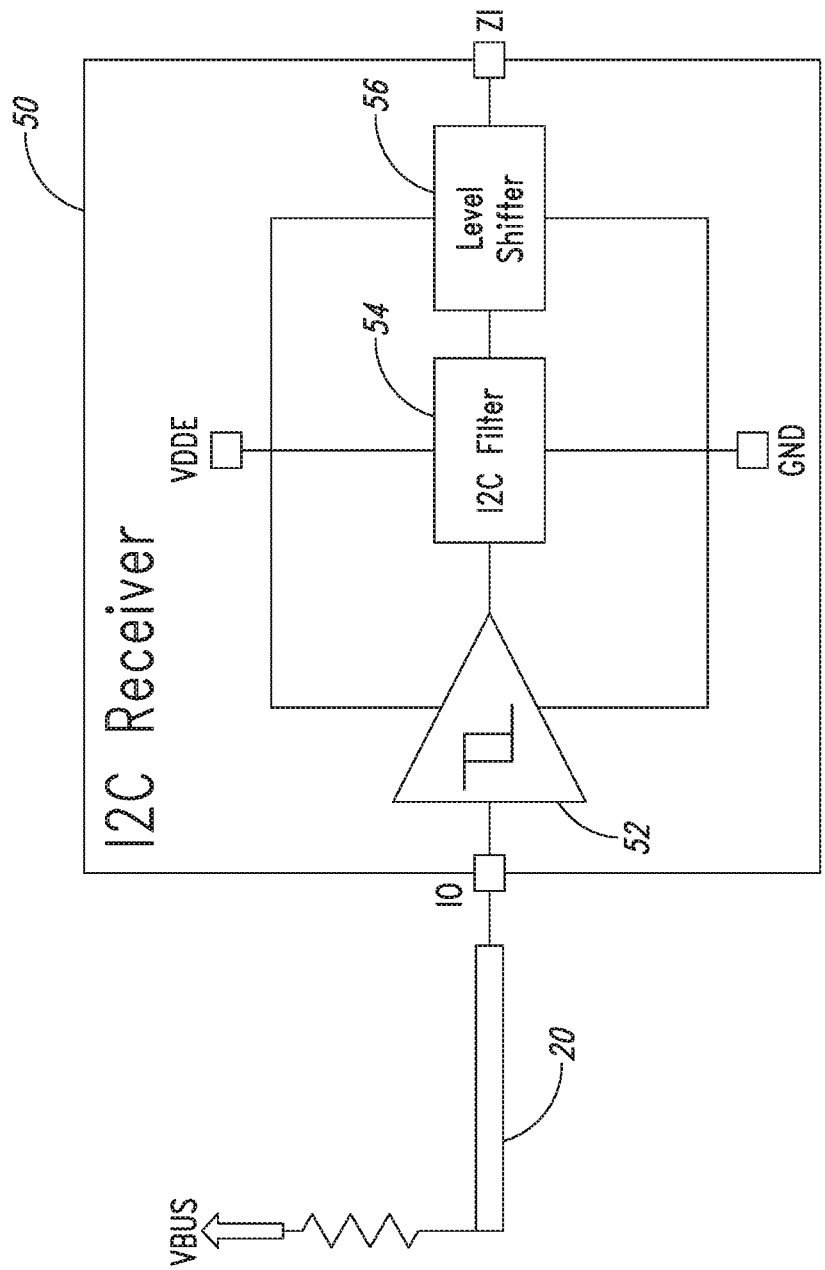
FIG. 2 is a schematic diagram illustrating an I2C receiver including a first input stage coupled to an unregulated supply voltage.

FIG. 2 is a schematic diagram illustrating an I2C receiver 50 that experiences similar problems as the I2C transmitter 10 of FIG. 1, due to variations in the supply voltage VDDE.

The I2C receiver 50 includes an input terminal 10 coupled to the I2C data line 20. A first stage 52 of the I2C receiver 50, which may be, for example, a Schimitt trigger or an inverter, is coupled to the input terminal 10. Additional circuitry, such as an I2C filter 54 and a level shifter 56 is coupled between the first stage 52 and an output terminal ZI.

In the I2C communication protocol, the bus supply VBUS can be uncorrelated to the IO supply, i.e., VDDE. This can lead to heavy current consumption in the first stage 52 of the I2C receiver 50, particularly, when the uncorrelated bus supply VBUS is at a voltage level that is substantially lower than the IO supply voltage VDDE. For example, in the case where the supply voltage VDDE ranges between about 1.62V and 3.78V and the bus supply voltage VBUS is 1.62V, a high short circuit current is present in the first stage 52 when the supply voltage VDDE is at 3.78V. This results in high current consumption in the I2C receiver 50, which reduces the battery life.

One approach to alleviating the problems of the I2C transmitter 10 of FIG. 1 and the I2C receiver 50 of FIG. 2 is to downgrade the mode of communication, e.g., from the Fast+ mode (1 Mbps) to the Fast mode (400 kbps) to meet the specifications of the transmitter 10. However, this reduction in speed reduces the efficiency of communication, which is undesirable. Another approach is to provide a set of bits to the IO that indicate various regions of voltage ranges of the IO supply. However, in such a case, the IO needs to be designed to meet specifications in a variety of different bands of supply voltages, which complicates the design process and requires additional circuitry and components. This approach results in an increased circuit area, as different parts of circuits may need to be multiplexed to work at a particular voltage band. Yet another approach may be to restrict the VBUS supply voltage to a narrow band of potential, and then to provide this info to the IO via selection bits. However, this approach requires additional IO pads on the chip in order to carry this information to the chip.

In accordance with various embodiments of the present disclosure, one or more of the drawbacks described above with respect to the I2C transmitter 10 of FIG. 1 and the I2C receiver 50 of FIG. 2 are reduced or eliminated by providing a stable reference voltage VREF to drive a pre-driver 114 of the transmitter and a first stage 152 of the receiver 150. The I2C transmitter and receiver can achieve operating speeds that improve operation of the processor or chip within which the I2C transmitter is positioned. For example, the I2C transmitter 10 can operate in the Fast+ mode, in which a communication speed of 1 Mbps is achieved.

By utilizing a stable reference voltage in the transmitter 10, the transmitter drive spread is decreased, and this reduced spread allows the transmitter 10 to meet the tighter specifications (e.g., Loopdelay) of the Fast+ mode. Accordingly, the I2C transmitter is capable of operating in a Fast+ mode of communication at all times.

Similarly, in the I2C receiver, the stable reference voltage is used to drive the first stage of the receiver. The stable reference voltage will be lower than a variable voltage of the I2C data line, as such a short circuit current is prevented in the first stage of the receiver, thereby decreasing power consumption and extending battery life.

The I2C transmitter and the I2C receiver may be on the same chip, with one of the transmitter or receiver being enabled at a time, i.e., via bidirectional communication. One or both of the I2C transmitter and the I2C receiver may be coupled to the stable reference voltage. The transmitter and receiver communicate with other chips on a same printed circuit board or within a same electronic device, such as a smart phone, a laptop, a notebook, a multimedia device, a digital audio player, a camera, a game console, a wearable computing device, an appliance, or the like.

Figure 3:
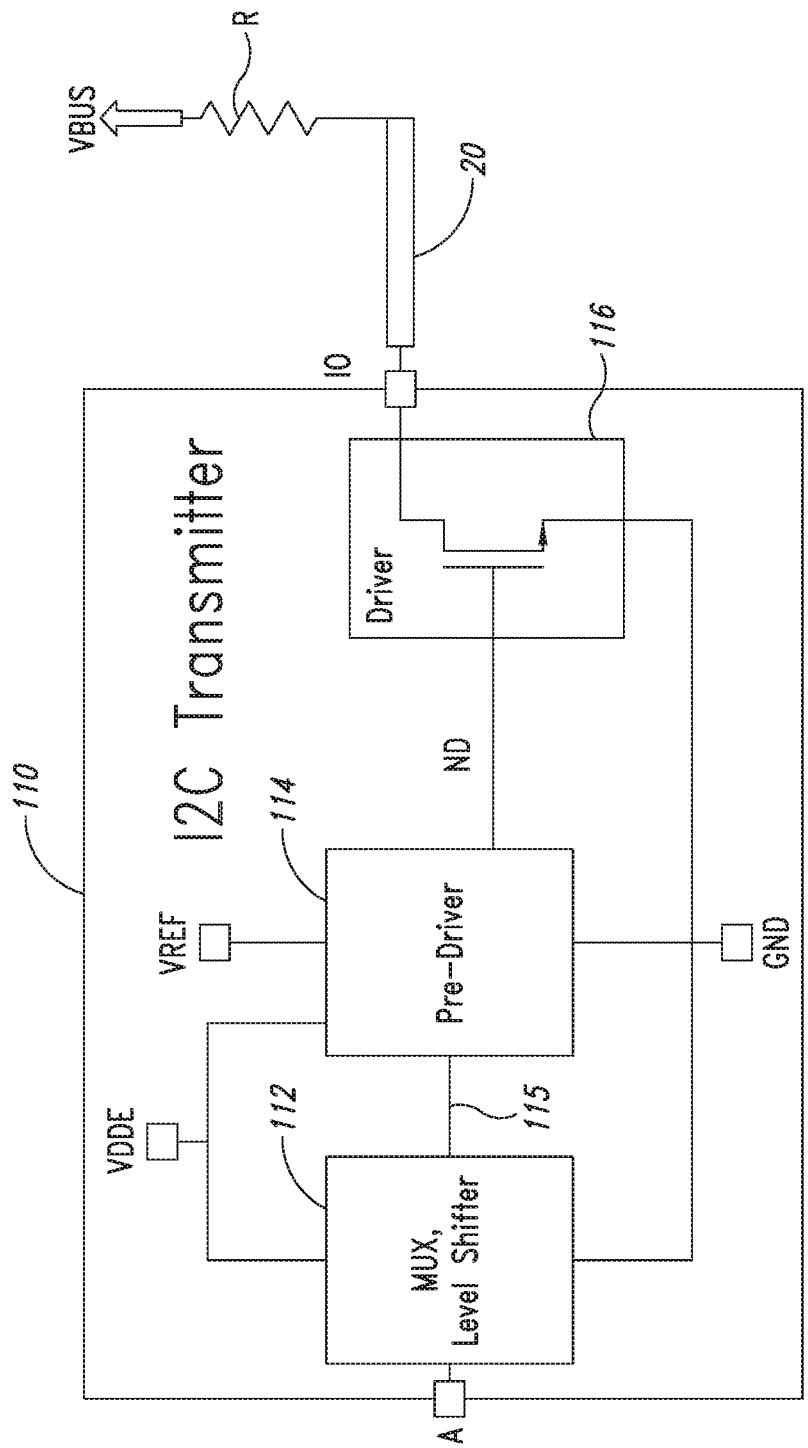
FIG. 3 is a schematic diagram illustrating an I2C transmitter having a pre-driver coupled to a stable reference voltage, in accordance with one or more embodiments of the present disclosure.

FIG. 3 illustrates an I2C transmitter 110 having a pre-driver 114 coupled to a stable supply voltage Vref, in accordance with one or more embodiments of the present disclosure. The transmitter 110 may be similar to the transmitter 10 shown in FIG. 1, with the differences as will be explained below. The transmitter 110 includes an input terminal A that receives a core signal that is to be communicated to the I2C data line 20 via an input/output terminal 10.

The core signal provided at the input terminal A may include multiple signals. For example, the core signal may include the chip level data signal that is to be communicated to the I2C data line 20, and may further include control signals, such as an enable signal or the like, for control of the circuitry in the transmitter 110. The multiplexer and level shifter 112 receives the signals and select and process the signals, e.g., by level shifting the received data signal, and provide the signals to the pre-driver 114. The multiplexer and level shifter 112 may be coupled to a first supply voltage VDDE and to a second supply voltage GND. The first supply voltage VDDE may be a variable supply voltage. For example, the supply voltage VDDE may vary from about 1.62V to about 3.78V, however the range of the voltages provided by the supply voltage VDDE are not limited thereto. For example, the supply voltage VDDE may be output within any range of voltages for operation of various battery operated circuits. The second supply voltage GND may be, for example, a low voltage or a ground voltage.

The pre-driver 114 receives a control signal and outputs a drive signal ND based on the control signal 115 from the MUX and level shifter 112. The pre-driver controls a driver 116, such as an NMOS driver with a control signal ND. The control signal ND is coupled to a gate of the NMOS transistor in the NMOS driver. Further details of the pre-driver 114 are shown in FIG. 4.

The driver 116 is connected as an open-drain driver that is provided as an NMOS transistor having a gate terminal coupled to the output of the pre-driver 114 and conduction terminals coupled between the input/output terminal 10 and the second supply voltage GND. Open-drain refers to a type of output which can either pull the I2C data line 20 down to a low voltage (e.g., GND), or "release" the I2C data line 20 so it may be pulled up to a bus voltage VBUS by a pull-up resistor R.

Accordingly, the input/output terminal 10 is coupled to the second supply voltage GND when a high voltage (e.g., logic 1) is applied to the gate of the driver 116, thereby pulling down the voltage on the I2C data line 20 to the second supply voltage GND level. When a low voltage (e.g., logic 0) is applied to the gate of the driver 116, the NMOS transistor is off, and the I2C data line 20 is released by the driver 116 thereby allowing the pull-up resistor R to raise the voltage on the I2C data line 20 to a high level.

Figure 4:
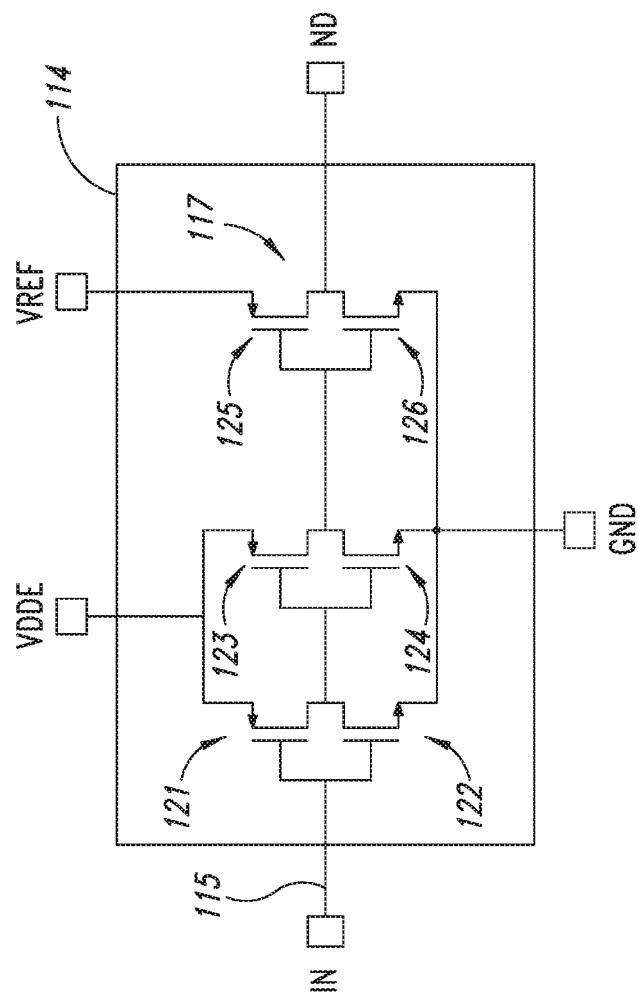
FIG. 4 is a schematic diagram illustrating further details of a pre-driver of the I2C transmitter shown in FIG. 3, in accordance with one or more embodiments of the present disclosure.

As shown in FIG. 4, the pre-driver 114 may include a plurality of elements, such as a plurality of transistors that are connected as one or more logic stages. The pre-driver 114 is coupled to the first supply voltage VDDE, which is a variable supply voltage and to the second supply voltage GND. That is, one or more of the elements in the pre-driver 114 are coupled between the variable first supply voltage VDDE and the second supply voltage GND. However, a last stage 117 or an output stage of the pre-driver 114 is coupled to a stable supply voltage Vref instead of the variable first supply voltage VDDE.

In particular, the pre-driver 114 may include a first pair of transistors 121, 122 that are coupled between the variable first supply voltage VDDE and the second supply voltage GND. Each of the transistors 121, 122 of the first pair of transistors have a respective gate terminal coupled to an input IN, to which the control signal 115 is supplied. A second pair of transistors 123, 124 are similarly coupled between the variable first supply voltage VDDE and the second supply voltage GND. Each of the transistors 123, 124 of the second pair of transistors have a respective gate terminal coupled to an output of the first pair of transistors 121, 122.

The pre-driver 114 may include a logic element such as a buffer or an inverter as the last stage 117 that outputs the drive signal ND to control the driver 116. The last stage 117 of the pre-driver 114 may include a third pair of transistors 125, 126, which are coupled between the stable supply voltage Vref and the second supply voltage GND. Since the last stage 117 of the pre-driver 114 is coupled between the stable supply voltage Vref and the second supply voltage GND, the drive signal ND is provided at either the stable supply voltage Vref or the second supply voltage, e.g., ground GND voltage levels. Thus, in contrast to the pre-driver 14 of the I2C transmitter 10 shown in FIG. 1, which outputs the drive signal ND with a voltage that swings between the variable first supply voltage VDDE and the second supply voltage GND, the pre-driver 114 outputs the drive signal ND with a voltage that swings between the stable supply voltage Vref and the second supply voltage GND. Because the stable supply voltage Vref is a constant voltage, there is no variation in the voltage level provided by the stable supply voltage Vref, and thus the drive signal ND has one of two possible values: the voltage level of the second supply voltage GND (e.g., 0V), or the voltage provided by the stable supply voltage Vref.

As shown in FIG. 3, by providing a stable supply voltage Vref to the last stage 117 of the pre-driver 114, the drive spread of the driver 116 is not dependent on a variable supply voltage (e.g., the variable first supply voltage VDDE, as in FIG. 1). Indeed, the spread of the drive current Idc in the I2C transmitter 110 is within a range of about 10 mA to about 22 mA in the I2C transmitter 110 of FIG. 3, which is significantly reduced with respect to the I2C transmitter 10 of FIG. 1, which varies from about 10 mA to about 72 mA when the supply voltage VDDE ranges between about 1.62V and 3.78V.

While it is possible to supply the stable supply voltage Vref to all of the stages of the pre-driver 114, the stable supply voltage may only be provided at last stage 117 of pre-driver 114, since that is the stage that outputs the drive signal ND at a level between 0 and Vref. Accordingly, in one or more embodiments the stable supply voltage Vref may be provided to all of the stages of the pre-driver 114, while in other embodiments the stable supply voltage Vref is supplied only to the last stage 117 of the pre-driver 114.

Figure 5:
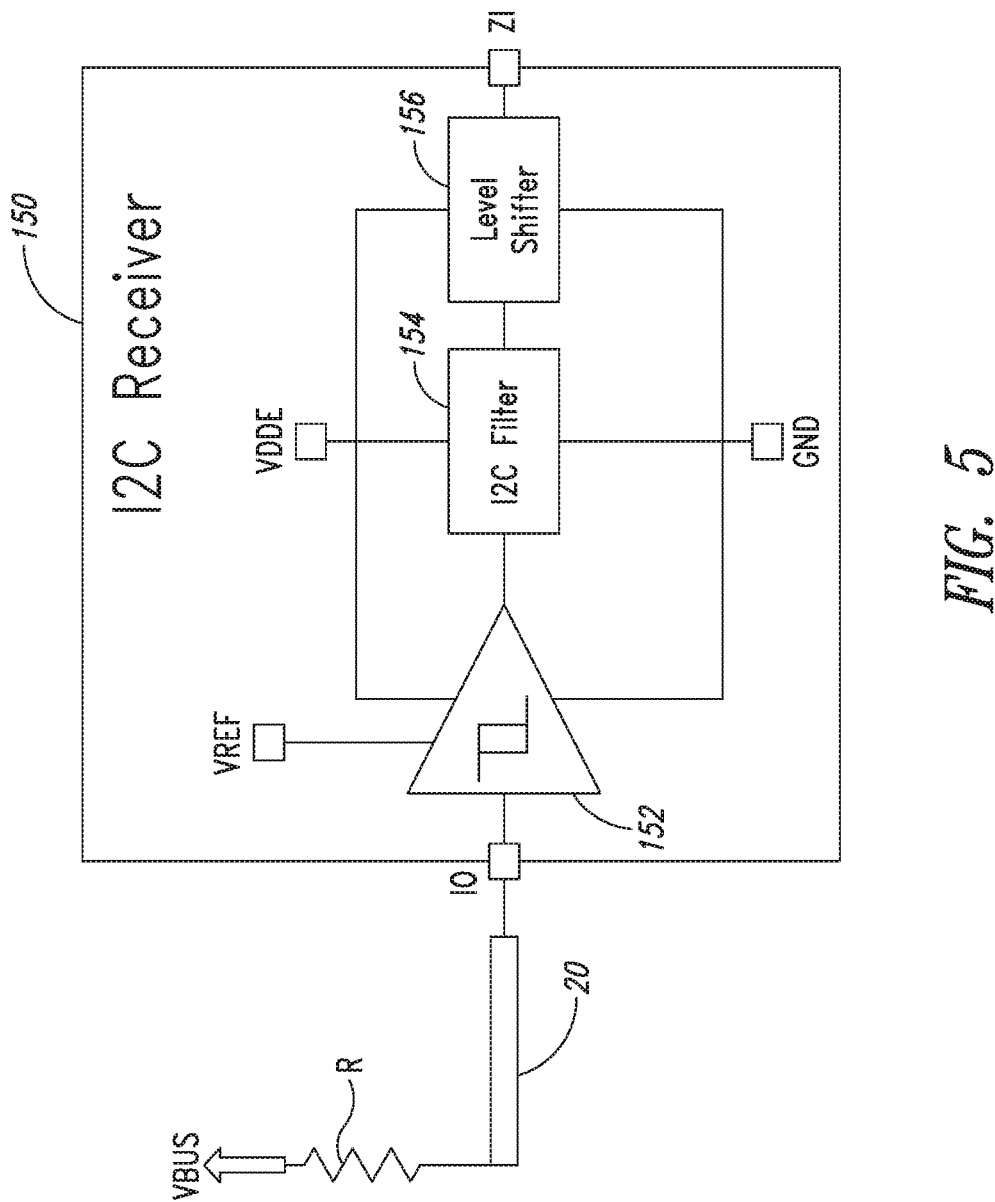
FIG. 5 is a schematic diagram illustrating an I2C receiver having a first input stage coupled to a stable reference voltage, in accordance with one or more embodiments of the present disclosure.

FIG. 5 illustrates an I2C receiver 150 having a first stage 152 coupled to a stable supply voltage Vref, in accordance with one or more embodiments of the present disclosure.

The I2C receiver 150 may be similar to the receiver 50 shown in FIG. 2, with the differences as will be explained below. The receiver 150 includes an input terminal 10 that is coupled to the I2C data line 20 and receives a data signal communicated from the I2C data line 20.

The first stage 152 of the I2C receiver 150 is coupled to the input terminal 10. The first stage 152 may include a plurality of elements, such as a plurality of transistors that are connected as one or more logic stages. For example, the first stage 152 of the receiver 150 may be, for example, an inverter or an inverting Schmitt trigger (as shown). The I2C receiver 150 may further include additional circuitry, such as an I2C filter 154 and a level shifter 156 coupled between the first stage 152 and an output terminal ZI.

Various circuitry included in the I2C receiver 150, such as the I2C filter 154 and the level shifter 156, may be coupled between the variable first supply voltage VDDE and the second supply voltage GND. However, the first stage 152 of the I2C receiver 150 is coupled to the stable supply voltage Vref instead of, or in addition to, the variable first supply voltage VDDE. The first stage 152 of the I2C receiver 150 may also be coupled to the variable first supply voltage VDDE, for example, to drive one or more transistors that are between an input element of the first stage 152 and an output element of the first stage 152. For example, the first stage 152 may be an inverting Schmitt trigger that includes an input transistor and one or more additional transistors. In such a case, the input transistor is coupled to the stable supply voltage Vref, while the additional transistors may be coupled to the variable first supply voltage VDDE.

The stable supply voltage Vref may be selected such that it is always at a voltage level that is lower than the bus supply voltage VBUS. The bus supply voltage VBUS may be a variable voltage. For example, the bus supply voltage VBUS may be from about 1.62V to about 3.6V in one or more embodiments. In such a case, the stable supply voltage Vref may be selected to be a steady voltage that is less than 1.62V, such that the stable supply voltage Vref is less than the bus supply voltage VBUS regardless of the variations of the bus supply voltage VBUS.

As discussed above with respect to the I2C receiver 50 shown in FIG. 2, a high short circuit current may be present in the first stage 52 when the supply voltage VDDE is higher than the uncorrelated bus supply voltage VBUS. However, in the I2C receiver 150 shown in FIG. 5, the first stage 152 is coupled between the stable supply voltage Vref and the second supply voltage GND. Since the stable supply voltage Vref may be selected to always be lower than the bus supply voltage VBUS, the short circuit current may be prevented in the first stage 152 regardless of the values of the variable first supply voltage VDDE and the bus supply voltage VBUS. Thus, in contrast to the I2C receiver 50 of FIG. 2, the first stage 152 of the I2C receiver 150 of FIG. 5 does not consume current even when the bus supply voltage VBUS is at its lowest value (e.g., 1.62V), since the stable reference voltage Vref is equal to or less than the bus supply voltage VBUS.

Figure 6:
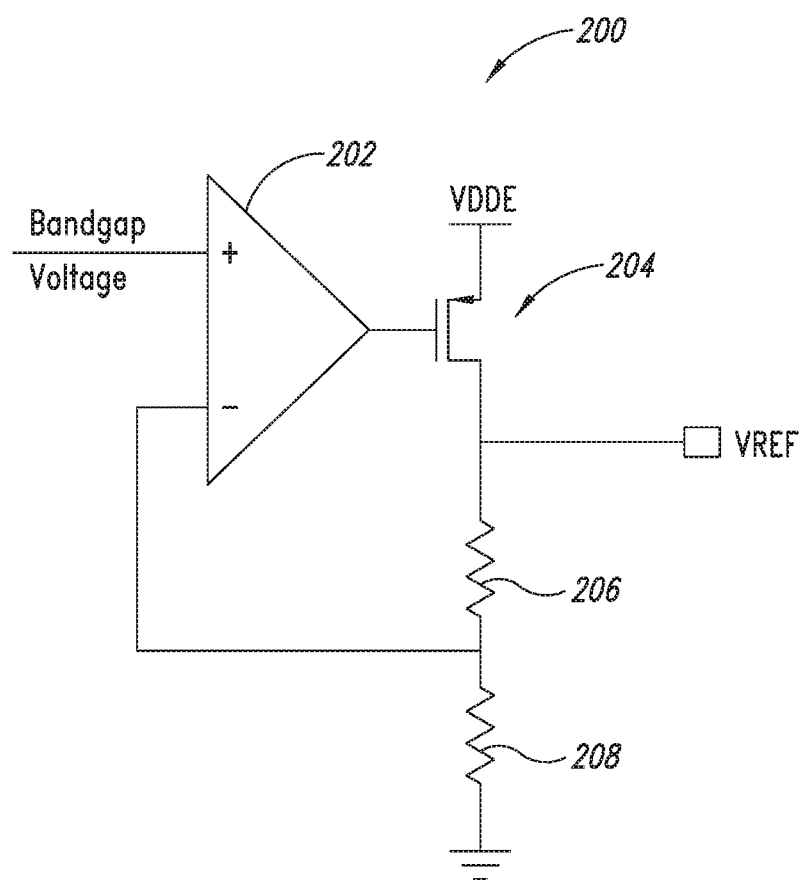
FIG. 6 is a schematic diagram illustrating a reference voltage generator, in accordance with one or more embodiments of the present disclosure.

FIG. 6 is a circuit diagram illustrating a reference voltage generator 200, in accordance with one or more embodiments of the present disclosure. The reference voltage generator 200 may be, for example, a low-dropout (LDO) regulator that generates the reference voltage Vref.

As shown in FIG. 6, the reference voltage generator 200 includes a differential amplifier 202, a transistor 204, and first and second resistors 206, 208. The differential amplifier 202 receives a steady reference voltage, such as a bandgap reference voltage, at a non-inverting terminal. The differential amplifier 202 has an inverting terminal coupled to a node between the first resistor 206 and the second resistor 208. An output of the differential amplifier 202 is coupled to the gate of the transistor 204, which has conduction terminals coupled between the variable first supply voltage VDDE and an output node that is coupled to the first resistor 206.

The inverting terminal of the differential amplifier 202 monitors the output voltage Vref through a voltage divider formed by the first and second resistors 206, 208. If the output voltage Vref rises or falls relative to the steady reference voltage, then the output of the differential amplifier 202 changes to drive the transistor 204 to maintain a constant output voltage Vref.

The reference voltage generator 200 may be designed to output the stable supply voltage Vref at a voltage level that is less than the lowest value of the bus supply voltage VBUS. For example, if the bus supply voltage VBUS varies from about 1.62V to about 3.6V, in one or more embodiments, then the reference voltage generator 200 may be designed to output the stable supply voltage Vref at a value of about 1.35V.

Figure 7:
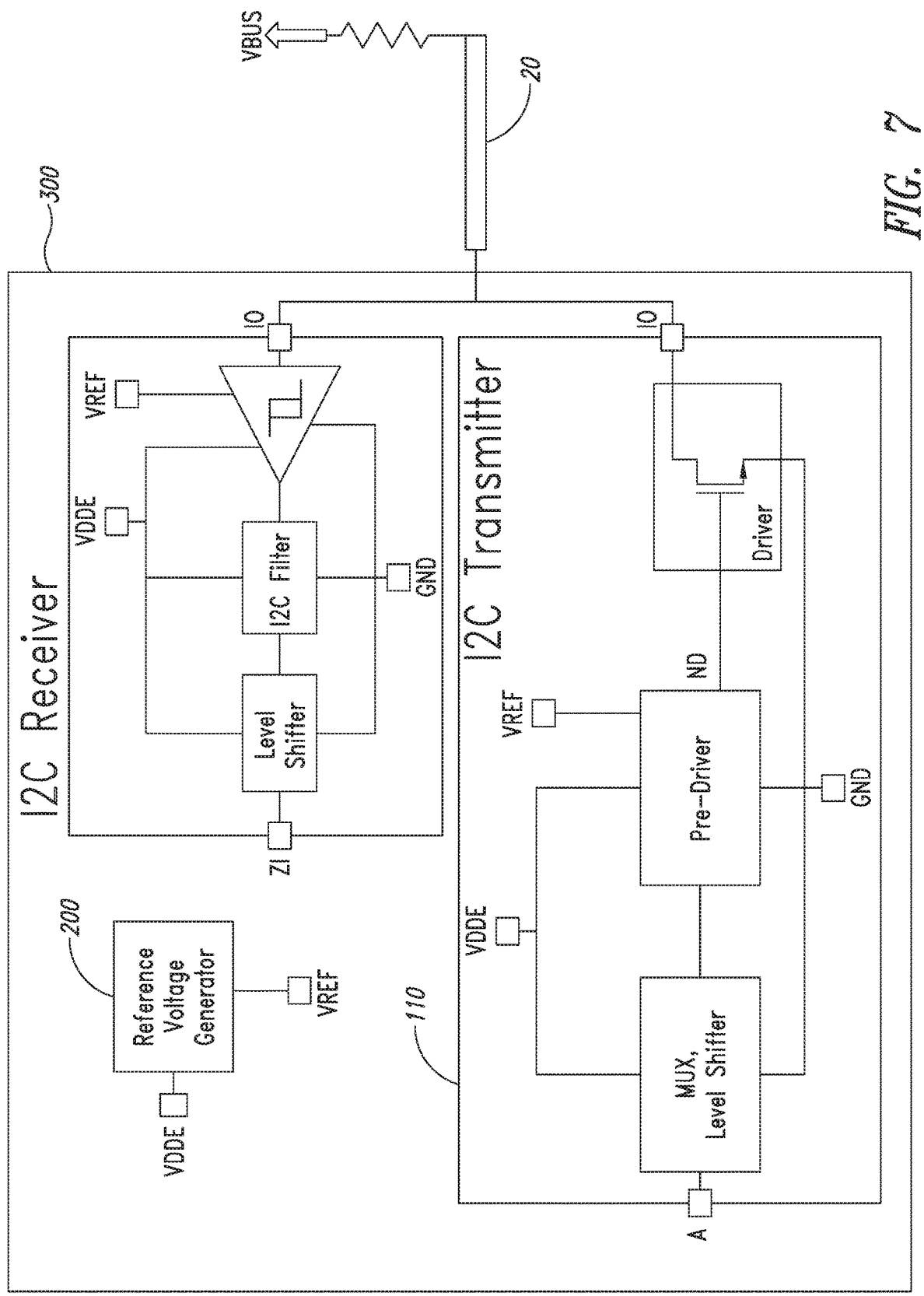
FIG. 7 is a schematic diagram illustrating an integrated circuit having an I2C transmitter and an I2C receiver coupled to a reference voltage generator, in accordance with one or more embodiments of the present disclosure.

FIG. 7 is a schematic diagram illustrating an integrated circuit (IC) 300 having an I2C transmitter and an I2C receiver coupled to a regulated supply voltage, in accordance with one or more embodiments of the present disclosure.

The IC 300 includes the I2C transmitter 110 of FIG. 3 and the I2C receiver 150 of FIG. 5, each of which is coupled to the I2C data line 20 via respective input/output terminals 10. The IC 300 may further include a reference voltage generator 200, for example as shown in FIG. 6. The reference voltage generator 200 may be included in the IC 300, as shown in FIG. 7. That is, the reference voltage generator 200 may be formed on a same semiconductor die or on a same chip as the IC 300. The reference voltage generator 200 generates the stable reference voltage Vref, which is supplied to the I2C receiver 150 and to the I2C transmitter 110.

Figure 8:
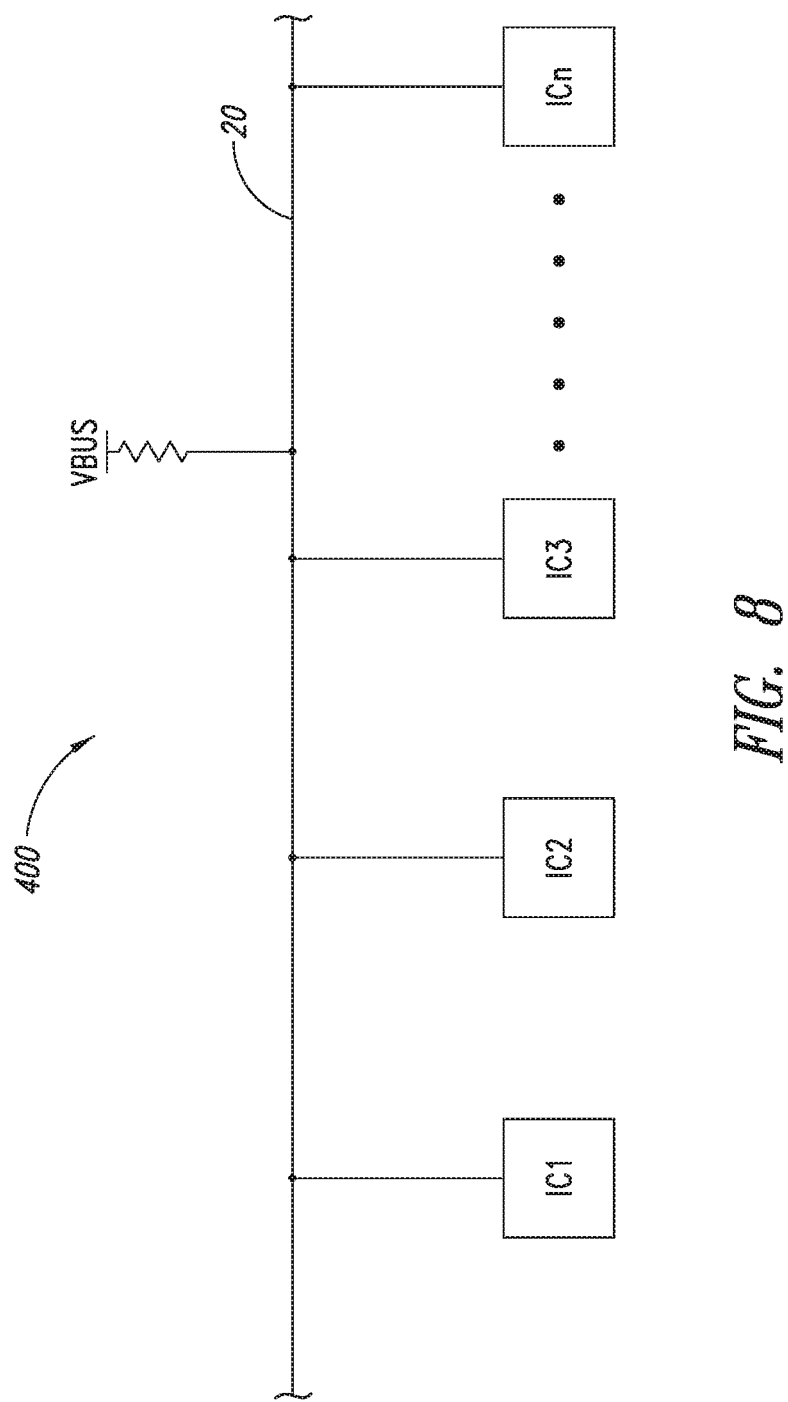
FIG. 8 is a schematic diagram illustrating a device including a plurality of integrated circuits, in accordance with one or more embodiments of the present disclosure.

FIG. 8 is a schematic diagram illustrating a device 400 that includes a plurality of integrated circuits communicatively coupled to one another by the I2C data line 20.

The plurality of integrated circuits IC1 to ICn may be connected to an I2C bus or I2C data line 20, which facilitates communication between the ICs. The device 400 may be any battery powered electronic device, including, for example, a smart phone, a laptop, a notebook, a multimedia device, a digital audio player, a camera, a game console, a wearable computing device, an appliance, or the like. The ICs may be any integrated circuits included in such devices, including, for example, integrated circuits for display drivers, LED controllers, bus controllers, memory, data converters, temperature sensors, image sensors, and the like.

One or more of the integrated circuits IC1 to ICn may include a reference voltage generator 200, for example, as shown in the integrated circuit 300 of FIG. 7. In one or more embodiments, each of the integrated circuits IC1 to ICn may include a reference voltage generator 200 for supplying a stable reference voltage Vref to the I2C transmitter 110 and the I2C receiver 150 within each respective integrated circuit. Alternatively, the device 400 may include a separate reference voltage generator 200 which supplies the stable reference voltage Vref to each of the integrated circuits IC1 to ICn.

As shown and described herein, the stable reference voltage Vref may be supplied to only a last stage of a pre-driver and to a first stage of the receiver, while other circuitry in the I2C transmitter and the I2C receiver is supplied with the variable first supply voltage VDDE. This is because providing a stable reference voltage to all of the circuitry within the I2C transmitter and receiver would require a reference voltage generator that is heavily loaded. In such a case, the loading on the reference voltage generator would need to be accounted for in the design of the circuit, which would result in a more expensive design and a larger circuit The I2C transmitters and I2C receivers described herein provide several advantages over prior designs. For example, the I2C transmitter described herein is capable of operation in the I2C Fast+ mode at all times. Further, there is no short circuit current consumption in the first stage of the I2C receiver. Additionally, a single I2C receiver can work with multiple boards, having different supplies, without the need of one or more additional supply selection pins at the chip level. That is, supply selection pins that are used in conventional circuits to inform the receiver of the level of the bus supply voltage VBUS and/or the level of VDDE are not needed, since the receiver input stage is regulated by the stable reference voltage Vref. Moreover, there is no need to regulate the whole VDDE supply, which might be feeding many blocks, since the reference voltage generation can be internal to the IO (i.e., the I2C transmitter or receiver). An inexpensive global reference generator could be used to generate the stable reference voltage Vref in one or more embodiments, with Vref being supplied to a relative low number of branches. In another embodiment, the reference voltage generator may be a low-dropout (LDO) regulator that generates the reference voltage Vref and that supplies it to a plurality of IOs, e.g., to share the reference voltage Vref to many such instances of IO in an IO-ring. This provides the advantage that one does not need to design a global reference generator for the whole VDDE, which might be very costly as VDDE is feeding many circuits.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An inter-integrated circuit (I2C) transmitter, comprising:
    an input terminal;
    an output terminal coupled to an I2C data line;
    a first supply voltage terminal coupled to a variable first supply voltage;
    a second supply voltage terminal coupled to a second supply voltage;
    a reference voltage terminal coupled to a reference voltage, the reference voltage having a stable voltage level;
    a driver coupled to the output terminal; and
    a pre-driver electrically coupled between the input terminal and the driver and coupled to the variable first supply voltage, the second supply voltage, and the reference voltage, the pre-driver configured to output a control signal to a control terminal of the driver, the reference voltage coupled to an output stage of the pre-driver that is subsequent to a stage of the pre-driver that receives the variable first supply voltage, the control signal shifting between the reference voltage and the second supply voltage based at least in part on an input signal at the input terminal.

2. The I2C transmitter of claim 1 wherein the driver includes an NMOS transistor connected in an open-drain configuration.

3. The I2C transmitter of claim 1, further comprising a multiplexer and level shifter coupled between the input terminal and the pre-driver, wherein the multiplexer and level shifter are coupled to the variable first supply voltage and to the second supply voltage.

4. The I2C transmitter of claim 1 wherein the pre-driver includes an inverter that is coupled between the reference voltage and the second supply voltage and that outputs the control signal.

5. The I2C transmitter of claim 1 wherein the I2C transmitter is operable to communicate at a rate of at least 1 megabit per second.

6. The I2C transmitter of claim 1 wherein a drive current of the driver ranges from about 10 mA to about 22 mA.

7. An inter-integrated circuit, comprising:
    an inter-integrated circuit (I2C) transmitter, including:
        an input terminal;
        an output terminal coupled to an I2C data line;
        a driver coupled to the output terminal; and
        a pre-driver electrically coupled between the input terminal and the driver, wherein the pre-driver includes a variable voltage terminal coupled to a first stage of the pre-driver and a stable reference voltage terminal coupled to an output stage of the pre-driver that is subsequent to the first stage, the pre-driver operable to provide a control signal to the driver that shifts between the stable reference voltage and a ground potential; and
    an inter-integrated circuit (I2C) receiver, including
        an input terminal coupled to an I2C data line;
        an output terminal;
        a first supply voltage terminal coupled to a variable first supply voltage;
        a second supply voltage terminal coupled to a second supply voltage;
        a reference voltage terminal coupled to a reference voltage generator circuit; and
        a first stage coupled to the I2C data line via the input terminal, the first stage coupled to the variable first supply voltage, the second supply voltage, and the reference voltage, wherein the reference voltage has a voltage level that is less than a lowest voltage level of a variable bus supply voltage supplied to the I2C data line,
        wherein the reference voltage generator circuit includes a differential amplifier and a resistive voltage divider coupled to a differential input of the differential amplifier.

8. The inter-integrated circuit of claim 7, further comprising:
    an I2C filter coupled to an output of the first stage; and
    a level shifter coupled between an output of the I2C filter and the output terminal.

9. The inter-integrated circuit of claim 7 wherein the first stage comprises at least one of an inverter and an inverting Schmitt trigger.

10. A device, comprising:
    a variable first supply voltage;
    a second supply voltage;
    a reference voltage having a stable voltage level;
    an inter-integrated circuit (I2C) data line;
    an I2C transmitter, including:
        an input terminal;
        a driver coupled to the I2C data line; and
        a pre-driver coupled to the variable first supply voltage, the second supply voltage, and the reference voltage, the pre-driver configured to output a control signal to a control terminal of the driver, the control signal having a voltage level that equals to one of the second supply voltage and the stable voltage level of the reference voltage, the reference voltage coupled to an output stage of the pre-drive that is subsequent to a stage of the pre-driver that receives the variable first supply voltage, the control signal shifting between the reference voltage and the second supply voltage based at least in part on an input signal at the input terminal; and an I2C receiver, including:
a first stage coupled to the I2C data line, the variable first supply voltage, the second supply voltage, and the reference voltage.

11. The device of claim 10 wherein the reference voltage has a voltage level that is less than a lowest voltage level of a variable bus supply voltage supplied to the I2C data line.

12. The device of claim 10, further comprising a reference voltage generator that generates the reference voltage.

13. The device of claim 12 wherein the reference voltage generator comprises a low-dropout regulator.

14. The device of claim 10 wherein the pre-driver of the I2C transmitter includes an inverter that is coupled between the reference voltage and the second supply voltage and that outputs the control signal.

15. The device of claim 10 wherein the pre-driver outputs the control signal having a voltage level of one of the second supply voltage and the reference voltage.

16. The device of claim 10 wherein the first stage of the I2C receiver comprises at least one of an inverter and an inverting Schmitt trigger.

17. The device of claim 10 wherein the second supply voltage is a ground voltage.

18. A method, comprising:
supplying a variable first supply voltage, a second supply voltage, and a stable reference voltage to a pre-driver of an inter-integrated circuit (I2C) transmitter, the reference voltage coupled to an output stage of the pre-driver that is subsequent to a stage of the pre-driver that receives the variable first supply voltage;
controlling, by the pre-driver, a driver of the I2C transmitter with a control signal having a control voltage level that equals to one of a voltage level of the second supply voltage and the stable reference voltage; and
supplying the variable first supply voltage, the second supply voltage, and the stable reference voltage to a first input stage of an I2C receiver.

19. The method of claim 18, further comprising:
generating the stable reference voltage by a low-dropout regulator.

20. The method of claim 19 wherein the low-dropout regulator is provided on a same semiconductor chip as the I2C transmitter and the I2C receiver.

* * * * *